US009117993B2

(12) United States Patent
Shimizu et al.

(10) Patent No.: US 9,117,993 B2
(45) Date of Patent: Aug. 25, 2015

(54) PIEZOELECTRIC ELEMENT AND STACKED PIEZOELECTRIC STRUCTURE

(75) Inventors: Hiroyuki Shimizu, Takasaki (JP); Yutaka Doshida, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 236 days.

(21) Appl. No.: 13/820,465

(22) PCT Filed: Aug. 22, 2011

(86) PCT No.: PCT/JP2011/068828
§ 371 (c)(1),
(2), (4) Date: Apr. 5, 2013

(87) PCT Pub. No.: WO2012/035932
PCT Pub. Date: Mar. 22, 2012

(65) Prior Publication Data
US 2013/0221807 A1    Aug. 29, 2013

(30) Foreign Application Priority Data
Sep. 14, 2010   (JP) .................................. 2010-206128

(51) Int. Cl.
| H01L 41/047 | (2006.01) |
| H01L 41/083 | (2006.01) |
| H01L 41/053 | (2006.01) |

(52) U.S. Cl.
CPC ........ H01L 41/0471 (2013.01); H01L 41/0475 (2013.01); H01L 41/0536 (2013.01); H01L 41/083 (2013.01)

(58) Field of Classification Search
CPC .......... H02N 2/02; H02N 2/04; H01L 41/047; H01L 41/0471; H01L 41/0472
USPC .......................................... 310/328, 365, 366
See application file for complete search history.

(56) References Cited

U.S. PATENT DOCUMENTS 5,089,739 A *  2/1992  Takahashi et al. ............. 310/328
6,121,718 A *  9/2000  Mohr, III ....................... 310/334

FOREIGN PATENT DOCUMENTS

| JP | H04-331155 A  | 11/1992 |
| JP | H07-030164 A1 | 1/1995  |

(Continued)

OTHER PUBLICATIONS

Notice of Reasons for Refusal issued by Japanese Patent Office, mailed Oct. 1, 2013, for Japanese counterpart application No. 2010-206128.

(Continued)

*Primary Examiner* — Derek Rosenau
(74) *Attorney, Agent, or Firm* — Law Office of Katsuhiro Arai (57) ABSTRACT

A stacked piezoelectric actuator has a laminate structure including piezoelectric layers and cover parts such that when an external electrode is applied with drive voltage, the piezoelectric layers become distorted and the entire stacked piezoelectric actuator deforms, and at that time, the cover parts become displaced, wherein the distortion difference occurring between the piezoelectric layers and the cover parts reduces, thereby inhibiting the development of cracks. Moreover, the surface area of the active region of the piezoelectric layers is the same as the surface area of the active region of the cover parts, and therefore the loss of the displacement transfer, which is produced by the piezoelectric layers, at the cover parts is reliably reduced.

2 Claims, 7 Drawing Sheets

(56) References Cited

FOREIGN PATENT DOCUMENTS

| | | |
|---|---|---|
| JP | H07-038168 A | 2/1995 |
| JP | H07-135348 A1 | 5/1995 |
| JP | H09-036450 A1 | 2/1997 |
| JP | 2000-150977 A1 | 5/2000 |
| JP | 2005-108989 A1 | 4/2005 |
| JP | 2010-161286 A | 7/2010 |

OTHER PUBLICATIONS

A Notification of Reasons for Refusal issued by the Japanese Patent Office, mailed Jan. 7, 2014, for Japanese counterpart application No. 2010-206128.

* cited by examiner

PIEZOELECTRIC ELEMENT AND STACKED PIEZOELECTRIC STRUCTURE

This application is the U.S. National Phase under 35 U.S.C. §371 of International Application PCT/JP2011/068828, filed Aug. 22, 2011, which claims priority to Japanese Patent Application No. 2010-206128, filed Sep. 14, 2010. The International Application was published under PCT Article 21(2) in a language other than English.

TECHNICAL FIELD

The present invention relates to a piezoelectric element and stacked piezoelectric structure, and more specifically to a stacked piezoelectric structure for piezoelectric actuators, etc., constituted by staking piezoelectric elements, each of which, in turn, is constituted by laminating piezoelectric layers made by piezoelectric ceramics, etc., and internal electrode layers.

BACKGROUND ART

Among stacked piezoelectric actuators, the laminated piezoelectric element described in Japanese Patent Laid-open No. 2005-108989 (Patent Literature 1) is known. This laminated piezoelectric element has a laminate constituted by laminating piezoelectric ceramic layers and internal electrode layers, where the internal electrode layers are comprised of first internal electrode layers and second internal electrode layers. The first internal electrode layers are led out alternately to different sides of the laminate. The second internal electrode layers are formed over roughly the entire cross-section of the laminate for each specified length dimension in the laminating direction of the laminate, and led out at least to one side of the laminate. Provided at the top and bottom of this laminated piezoelectric element are protective layers that serve as points of contact with the target object to be driven. With this type of laminated piezoelectric element, electric field is first applied between the second internal electrode layers to achieve overall polarization whereby the domain direction of the laminate as a whole is oriented roughly to the laminating direction, after which electric field is applied to the laminate via the first internal electrode layers to achieve inter-layer polarization.

As another disclosed example, the laminated piezoelectric element described in Japanese Patent Laid-open No. Hei 7-135348 (Patent Literature 2) is known. This laminated piezoelectric element comprises: multiple piezoelectric layers; internal electrodes that are provided between the piezoelectric layers and led out, depending on the polarity, to one of the two opposing side faces; and two external electrodes that each connect to the internal electrodes of the same polarity led out to one of the two side faces, where the two external electrodes are formed in such a way that each electrode covers the side face to which the internal electrodes of the same polarity have been led out, as well as the top side and bottom side of the side face.

BACKGROUND ART LITERATURES

Patent Literatures

Patent Literature 1: Japanese Patent Laid-open No. 2005-108989
Patent Literature 1: Japanese Patent Laid-open No. Hei 7-135348

SUMMARY OF THE INVENTION

Problems to Be Solved by the Invention

With the aforementioned laminated piezoelectric element described in Patent Literature 1, however, the protective layers at both ends are piezoelectrically inactive and consequently, displacement transmission loss may occur where displacement of the drive part is restricted and not transmitted efficiently. In addition, electrode connections used in the first polarization must be removed before the second polarization. There are other problems, such as the external electrode structure becoming complex.

Also with the laminated piezoelectric element described in Patent Literature 2, the piezoelectric layers at the top and bottom ends are polarized at the ends, but not near the center, and consequently, here, too, displacement transmission loss may occur.

The present invention was made by focusing on the above points, and various embodiments of the present invention provide piezoelectric elements and stacked piezoelectric structures that can reduce displacement transmission loss in a favorable manner, while preventing generation of cracks.

Means for Solving the Problems

A piezoelectric element pertaining to an embodiment of the present invention is characterized in that:
multiple first piezoelectric layers having internal electrodes led out to a first area and multiple second piezoelectric layers having internal electrodes led out to a second area different from the first area, are alternately laminated;
covers constituted by piezoelectric layers are formed at the ends in the laminating direction;
a first external electrode is provided that applies drive voltage of first polarity to each of the internal electrodes led out to the first area, while a second external electrode is provided that applies drive voltage of second polarity to each of the internal electrodes led out to the second area;
multiple sets of these piezoelectric elements are stacked to form a stacked piezoelectric structure;
cover electrodes are formed on the exposed sides of the covers in a manner covering at least areas near the centers of the covers;
each cover electrode is connected, via the cover, to the external electrode to which drive voltage of the polarity different from the opposing internal electrode is applied; and
the cover electrode and opposing internal electrode are used to polarize and activate at least the areas near the centers of the cover.

A piezoelectric element pertaining to another embodiment of the present invention is characterized in that:
first and second cover electrodes are formed on the exposed sides of the covers;
the first cover electrode covers an area at least near the center of the cover, where the first cover electrode is connected, via the cover, to the external electrode to which drive voltage of the polarity different from the opposing internal electrode is applied; and
the second cover electrode is connected, via the cover, to the external electrode to which drive voltage of the polarity same as the opposing internal electrode is applied; and
the first cover electrode and opposing internal electrode are used to polarize and activate an area at least near the center of the cover.

In an embodiment of the present invention, insulation layers are formed around the cover electrodes.

A stacked piezoelectric structure pertaining to an embodiment of the present invention is constituted by stacking a multiple number of either of the piezoelectric elements mentioned above, in such a way that the cover electrodes to which drive voltage of the same polarity is applied join together and that the external electrode to which drive voltage of the same polarity is applied becomes flush therewith. The object, characteristics, and benefits of the present invention are made clearer from the following detailed explanation and attached drawings.

Effects of the Invention

According to the present invention, polarization and activation of areas near the centers of covers allows displacement transmission loss to be reduced in a favorable manner and also prevents generation of cracks.

MODE FOR CARRYING OUT THE INVENTION

Example 1

Figure 1:
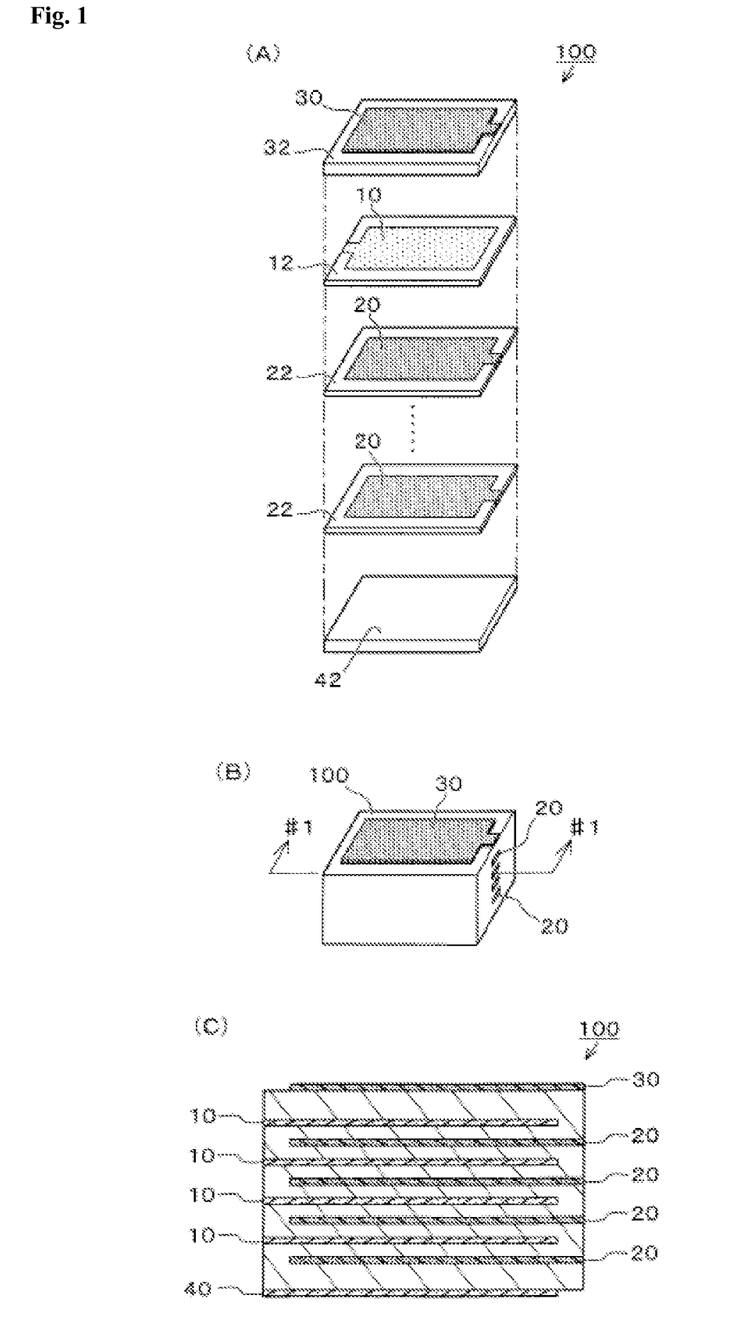
FIG. 1 is a drawing showing a piezoelectric element pertaining to an embodiment of the present invention.

A mode for carrying out the present invention is explained below in detail based on an example by referring to the attached drawings. In the attached drawings, identical or corresponding elements are given the same reference numerals and their detailed explanation is omitted as deemed appropriate. The piezoelectric element constituting Example 1 is explained by referring to FIGS. 1 to 4. As shown in FIG. 1 (A), the piezoelectric element 100 pertaining to an embodiment of the present invention is constituted by laminating covers 32, 42 on which cover electrodes 30, 40 are formed, at the top and bottom of a laminated structure made by laminating multiple piezoelectric layers 12 each having an internal electrode 10 on its surface, and multiple piezoelectric layers 22 each having an internal electrode 20 on its surface, alternately.

The cover electrodes 30, 40 are constituted in the same shapes as the internal electrodes 10, 20. The cover electrodes 30, 40 are also constituted to have virtually the same areas as the internal electrodes 10, 20. Additionally, the cover electrodes 30, 40 are positioned in a manner overlapping with the internal electrodes 10, 20. The cover electrode 30 is led out in the same direction as the internal electrode 20, while the cover electrode 40 is led out in the same direction as the internal electrode 10.

Internal electrodes 10 are formed on the surfaces of the multiple piezoelectric layers 12, respectively, and internal electrodes 20 are formed on the surfaces of the multiple piezoelectric layers 22, respectively. These internal electrodes 10, 20 and cover electrodes 30, 40 are formed by means of printing, for example.

FIG. 1 (B) shows an exterior view of the piezoelectric element 100 constituted by the piezoelectric layers 12, 22 and covers 32, 42 laminated together. FIG. 1 (C) shows a cross-section of FIG. 1 (B), cut along line #1-#1 and viewed in the direction of the arrow. As shown, the piezoelectric element 100 has a total of eight piezoelectric layers laminated together, including four piezoelectric layers 12 and four piezoelectric layers 22. When manufacturing the piezoelectric element 100, the entire piezoelectric element 100 is sintered at the same time in the laminated condition shown in FIG. 2. Also, the top and bottom faces of the covers 32, 42 are polished after the simultaneous sintering in order to ensure smoothness of surface.

Figure 2:
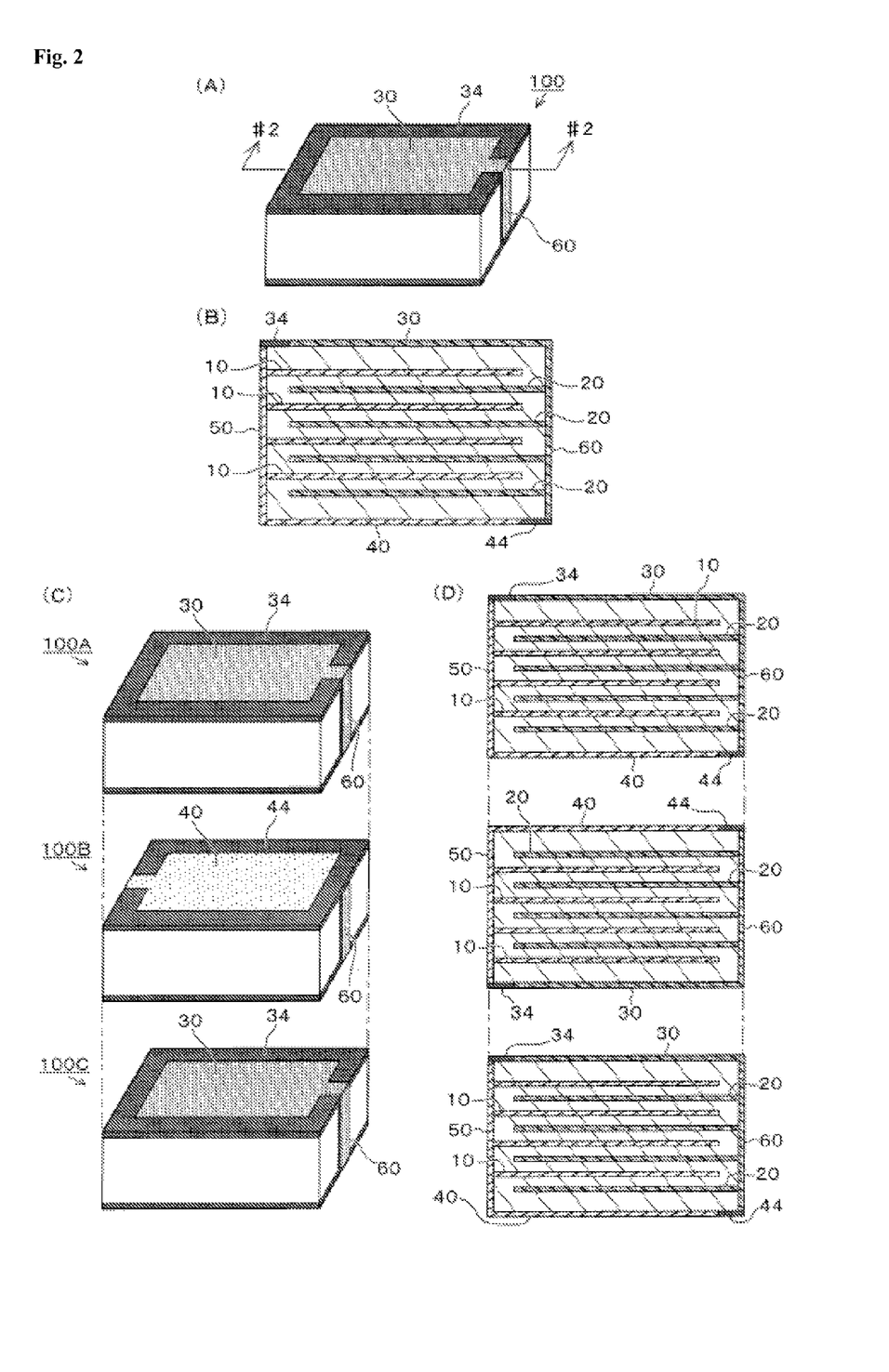
FIG. 2 is a drawing showing the laminated structure of a piezoelectric element for a stacked piezoelectric actuator pertaining to an embodiment.

Next, the process of forming external electrodes is explained by referring to FIGS. 2 (A) and (B). FIG. 2 (A) shows an exterior view of the piezoelectric element constituting a stacked piezoelectric actuator pertaining to an embodiment of the present invention. FIG. 2 (B) shows a cross-section of FIG. 2 (A), cut along line #2-#2 and viewed in the direction of the arrow. First, insulation layers 34, 44 are formed around, and at the same thicknesses as, the cover electrodes 30, 40 of the piezoelectric element 100 shown in FIG. 1. Thereafter, external electrodes 50, 60 are formed at the internal electrode output ports in the side faces of the piezoelectric element 100, respectively. The external electrode 50 is connected to the internal electrode 10 and the leader part of the cover electrode 40, respectively, while the external electrode 60 is connected to the internal electrode 20 and the leader part of the cover electrode 30, respectively. The piezoelectric element 100 pertaining to an embodiment of the present invention is thus obtained.

FIG. 2 (C) is a schematic view of a multiple number of piezoelectric elements 100 pertaining to an embodiment of the present invention stacked together. FIG. 2 (D) is a schematic cross-section view of the stacked piezoelectric elements 100. A stacked piezoelectric actuator pertaining to an embodiment of the present invention is constituted by stacking the necessary number of the aforementioned piezoelectric elements 100. In an embodiment, three piezoelectric elements 100A to 100C are stacked, as illustrated. In an embodiment, multiple piezoelectric elements 100 are stacked with the alternate piezoelectric layers 100 oriented upside down. When three piezoelectric elements 100A to 100C are stacked, as illustrated, for example, the center piezoelectric element 100B is placed upside down. This way, multiple piezoelectric elements 100 are placed in such a way that their cover electrodes 30, and cover electrodes 40, face and contact each other, as illustrated. When the piezoelectric elements 100 are stacked, therefore, the external electrode 50, of each piezoelectric element 100, is exposed to the same side of the stacked piezoelectric element 100. Similarly, the external electrode 60, of each piezoelectric element 100, is exposed to the same side of the stacked piezoelectric element 100.

The piezoelectric layers 12, 22 are made of piezoelectric ceramic green sheets of 25 μm in layer thickness, for example. The internal electrodes 10, 20 are made of Ag, Ag/Pd (mole ratio of 7/3 to 95/5), Pt, Cu, Ni, etc., for example. The internal electrodes 10, 20 are formed by means of printing, etc., in such a way as to cover at least about 50%, for example, of the surfaces of piezoelectric layers 12, 22. The piezoelectric element 100 in an embodiment is constituted by laminating twenty piezoelectric layers 12, 22 on which internal electrodes 10, are formed. The cover 32 is constituted by laminating multiple piezoelectric ceramic green sheets of 25 μm in layer thickness, for example. The overall thickness of the cover 32 becomes 200 μm, for example. Similarly, the cover 42 is constituted by laminating multiple green sheets to the overall thickness of approx. 200 μm. The cover electrodes 30, 40 are constituted in the same ways as the internal electrodes 10, 20. The insulation layers 34, 44 are made of polyimide, for example. The external electrodes 50, 60 are made of Ag, for example, and formed by sputtering, thermoset-resin bonding, baking, or other methods. The external electrodes 50, 60 are formed with good adhesion, by means of baking, on the side faces of the piezoelectric element 100.

Figure 3:
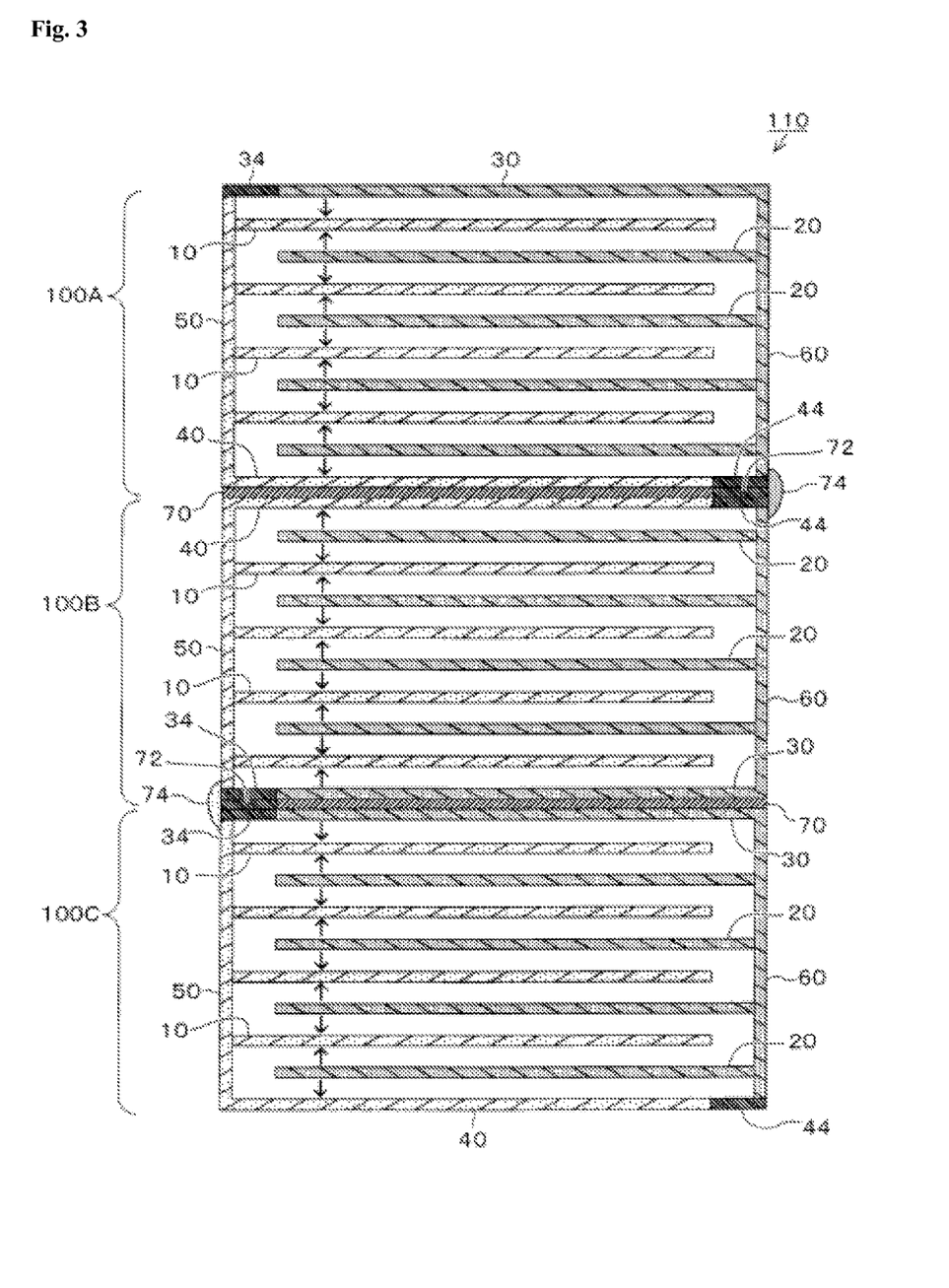
FIG. 3 is a drawing showing a key cross-section structure of a stacked piezoelectric actuator pertaining to an embodiment.

FIG. 3 shows a key cross-section structure of a stacked piezoelectric actuator pertaining to an embodiment of the present invention. As illustrated, the stacked piezoelectric actuator 110 pertaining to an embodiment of the present invention is formed by connecting piezoelectric elements 100A to 100C that are placed as mentioned above. In an embodiment, the cover electrodes 30, and cover electrodes 40, are inter-connected to the surface of rigid adhesive (such as adhesive having the same level of elasticity as the cover electrodes 30 or cover electrodes 40), by an adhesive layer 70 to which conductivity has been added, by means of sputtering, etc. The cover electrodes 30, and cover electrodes 40, can be inter-connected using highly elastic conductive adhesive. The insulation layers 34, and insulation layers 44, are inter-connected by an epoxy or other insulation layer 72, to ensure insulation property between the electrodes. The external electrodes 50, and external electrodes 60, are inter-connected electrically by a bridge 74 made of conductive paste, etc.

When polarization voltage is applied between the external electrode 50 and external electrode 60, in the above condition, the piezoelectric layers 12, 22 and covers 32, 42 are polarized. For example, positive voltage is applied to the external electrode 50, while negative voltage is applied to the external electrode 60. This way, the piezoelectrically inactive layers are polarized and become active. In an embodiment, this integral polarization treatment may be replaced by a polarization treatment whereby voltage is applied to the external electrodes 50, 60 in the condition of the piezoelectric element 100 shown in FIGS. 2 (A) and (B) (in other words, on the piezoelectric element 100 alone as shown in FIGS. 2 (A) and (B)). FIG. 3 shows the polarization direction of each layer using an arrow. As illustrated, the polarization direction is reversed on both sides of the internal electrodes 10, 20. The piezoelectric layers 12, 22 have a different thickness from the covers 32, 42, but since the inter-electrode application voltage applied to the piezoelectric layers 12, 22 at the time of polarization treatment is the same as the inter-electrode application voltage applied to the covers 32, 42, the effective field intensity varies between the piezoelectric layers 12, 22 and covers 32, 42 and their polarization states (strains) are also different. This polarization state difference is defined by a combination of the thickness of piezoelectric layers 12, 22 and thickness of covers 32, 42.

Figure 4:
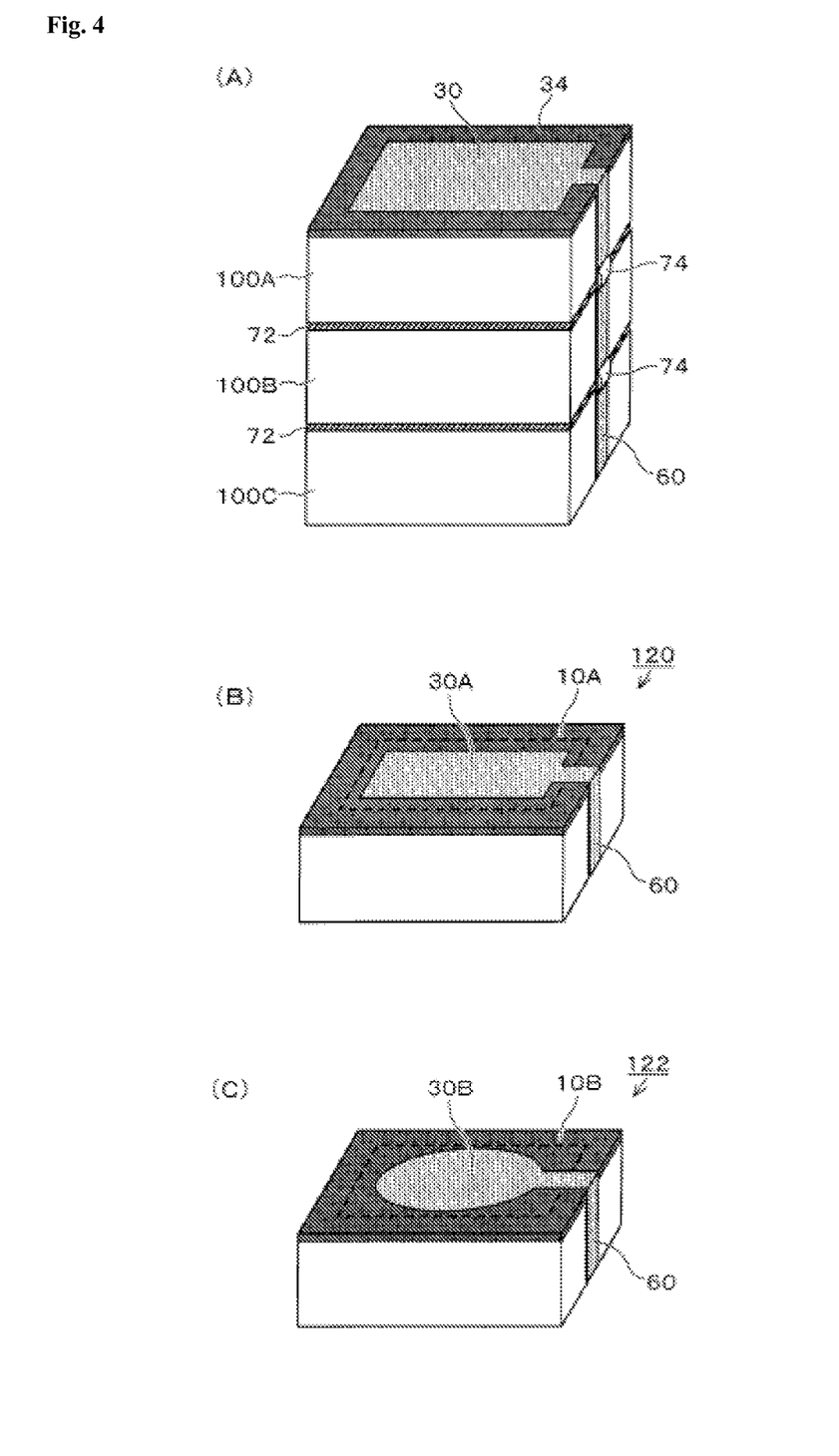
FIG. 4 is a drawing showing an exterior view of a stacked piezoelectric actuator pertaining to an embodiment, and other examples.

A stacked piezoelectric actuator 110 is obtained from the above polarization treatment. FIG. 4 (A) shows an exterior view of the stacked piezoelectric actuator 110 pertaining to an embodiment of the present invention.

Next, the operation to drive the stacked piezoelectric actuator 110 pertaining to an embodiment of the present invention is explained. First, drive voltage is applied to the external electrodes 50, 60. This drive voltage causes the piezoelectric layers 12, 22 and covers 32, 42 to strain according to the applied electric field, and the stacked piezoelectric actuator 110 as a whole deforms according to these strains. In an embodiment of the present invention, the covers 32, 42 are also displaced due to the drive voltage, and therefore the strain differences between the piezoelectric layers 12, 22 and covers 32, 42 are reduced and generation of cracks is suppressed. If the active areas of the piezoelectric layers 12, 22 are equal to the active areas of the covers 32, 42, losses that are caused by the covers 32, 42 in the displacement transmission generated by the piezoelectric layers 12, 22 decrease in a favorable manner.

Under the constitution in an embodiment of the present invention, the cover electrodes 30, 40 may be larger in area than the internal electrodes 10, 20. Even when the cover electrodes 30, 40 are formed larger in area than the internal electrodes 10, 20, the sizes of polarized active areas of the covers 32, 42 remain virtually equivalent to the constitution where the cover electrodes 30, 40 are equal in area to the internal electrodes.

FIG. 4 (B) shows a piezoelectric element 120 pertaining to another embodiment of the present invention. This piezoelectric element 120 is constituted in such a way that the cover electrode 30A is smaller in area than the internal electrode 10A. This way, the active area of the cover of the piezoelectric element 120 becomes narrower than in the piezoelectric element 100, but because any stacked piezoelectric structure generally undergoes large displacement near the center of the cover, displacement transmission loss can be reduced and crack generation prevented when multiple elements are connected, as long as their covers are polarized near the center.

FIG. 4 (C) shows a piezoelectric element 122 pertaining to another embodiment of the present invention. The piezoelectric element 122 has a cover electrode 30B formed in a circular shape. In this example, the four corners of the internal electrode 10B do not overlap with the cover electrode 30A and therefore parts corresponding to the four corners of the internal electrode 10B are not polarized. Since the cover is polarized near the center, however, displacement transmission loss is reduced and crack generation also is prevented just like in FIG. 4 (B).

As explained above, the following effects are realized in this example:

(1) Since cover electrodes 30, 40 of the same shape as the internal electrodes 10, 20 are formed on the covers 32, 42, the covers 32, 42 will have electric fields of effective areas equivalent to the piezoelectric layers 12, 22. Also because the covers 32, 42 and piezoelectric layers 12, 22 have electric fields of equal effective areas, their respective parts of equal areas will become piezoelectrically active layers when drive voltage is applied, and displacement transmission losses are reduced as a result.

(2) The cover electrodes 30, 40 need not be separated after polarization, which not only reduces manufacturing man-hours, but it also allows the elements to be connected directly, and the connected elements can be integrally polarized after the external electrodes 50, 60 are inter-connected.

(3) Because the thickness of piezoelectric layers 12, 22 is different from the thickness of covers 32, 42, the effective field intensity of piezoelectric layers 12, 22 is also different from the effective field intensity of covers 32, 42, and therefore the piezoelectric layers 12, 22 and covers 32, 42 have different polarized states once they become piezoelectrically active layers. However, the difference in polarized state (difference in strain) between both can be regulated by regulating the thickness of piezoelectric layers 12, 22 and the thickness of covers 32, 42.

(4) As the covers 32, 42 are made into piezoelectrically active layers identical to the piezoelectric layers 12, 22, the amount of strain of covers 32, 42 becomes closer to the amount of strain of piezoelectric layers 12, 22, as compared to when the covers 32, 42 are piezoelectrically inactive. As a result, cracks can be prevented or reduced when displacement occurs.

(5) When samples of the present invention were tested and compared against the stacked piezoelectric element per the aforementioned prior art (Patent Literature 2), the results shown in Table 1 were obtained. Comparison of crack generation ratios per 100 products after 1 million ON/OFF operations of drive voltage found that, while 50 products generated cracks under the prior art, no cracks generated under the present invention. The relative displacement amount was 1.25, indicating greater displacement as compared to when the covers were not polarized.

TABLE 1

|  | Covers not polarized (Japanese Patent Laid-open No. Hei 7-135348) | Covers polarized (Present invention) |
| --- | --- | --- |
| Crack generation ratio (per 100 products) After 1,000,000 power ON/OFF operations | 50/100 | 0/100 |
| Relative displacement amount 1.00 when covers are not polarized | 1.00 | 1.25 |

Example 2

Figure 5:
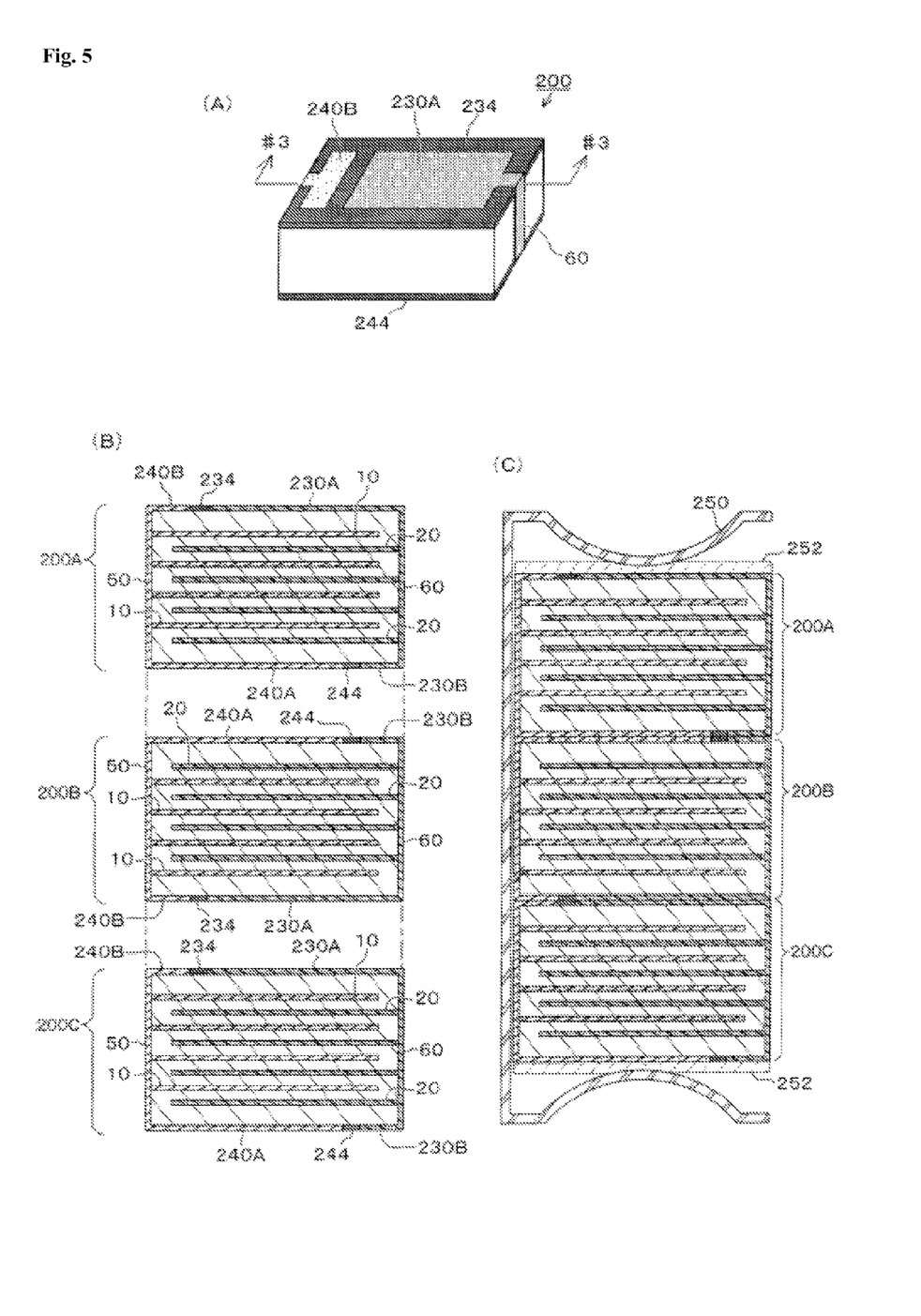
FIG. 5 is a drawing showing a piezoelectric element pertaining to another embodiment of the present invention.

Next, Example 2 of the present invention is explained by referring to FIG. 5. In Example 2 of the present invention, cover electrodes are formed on both the front side and back side of the piezoelectric element, to simplify and facilitate the inter-connection of piezoelectric elements. FIG. 5 (A) shows an exterior view of the piezoelectric element 200 pertaining to Example 2 of the present invention. FIG. 5 (B) is a schematic illustration of the condition where a multiple number of piezoelectric elements 200 pertaining to Example 2 of the present invention are stacked. FIG. 5 (C) shows an actuator obtained by stacking piezoelectric elements 200 pertaining to Example 2 of the present invention. As illustrated, the external electrode 60 of the piezoelectric element 200 is connected to the cover electrode 230A on the top side and cover electrode 230B on the bottom side, respectively. The external electrode 50 is connected to the cover electrode 240A on the bottom side and cover electrode 240B on the top side, respectively.

On the top side of the piezoelectric element 200, the cover electrode 230A is formed larger in area than the cover electrode 240B, as shown in FIG. 5 (A). An insulation layer 234 is formed around the cover electrode 230A and cover electrode 240B to insulate the two electrodes and align their thicknesses. On the bottom side of the piezoelectric element 200, the cover electrode 240A is formed larger in area than the cover electrode 230B. An insulation layer 244 is formed around the cover electrode 240A and cover electrode 230B to insulate the two electrodes and align their thicknesses.

A multiple number of aforementioned piezoelectric elements 200 are alternately turned upside down and stacked, as shown in FIG. 5 (B). In the example illustrated, an upside-down piezoelectric element 200B is placed between piezoelectric elements 200A and 200C. This way, the cover electrodes 240A and cover electrodes 230B are inter-connected, respectively, between the piezoelectric elements 200A and 200B, while the cover electrodes 230A and cover electrodes 240B are inter-connected, respectively, between the piezoelectric elements 200B and 200C.

The covers 32, 42 are polarized over the area sandwiched between the cover electrode 230A having a larger area and internal electrode 10, and over the area sandwiched between the cover electrode 240A having a larger area and internal electrode 20, respectively. This makes the active areas narrower as compared to Example 1 mentioned above, but since the centers are polarized with both covers, displacement transmission loss is reduced and crack generation is prevented just like in Example 1. Additionally, leader lines can be provided on the same end face for application of drive voltage.

In this example, cover electrodes of different polarities are exposed to both the top side and bottom side of the piezoelectric element 200. When these piezoelectric elements 200 are stacked, therefore, their external electrodes can be inter-connected without providing a bridge between the external electrodes. In the example shown in FIG. 5 (C), stacked piezoelectric elements 200A, 200B, 200C are supported from top and bottom using spring means 250, so that the stacked structure can be retained without using adhesive, etc. A spacer 252 is provided between the spring means 250 and the top end of the piezoelectric element 200A, and between the spring means 250 and the bottom end of the piezoelectric element 200C, for the purpose of insulation, etc. Additionally, a structure that gives displacement to the outside (not illustrated) can be provided for the stacked structure shown in FIG. 5 (C).

Example 3

Figure 6:
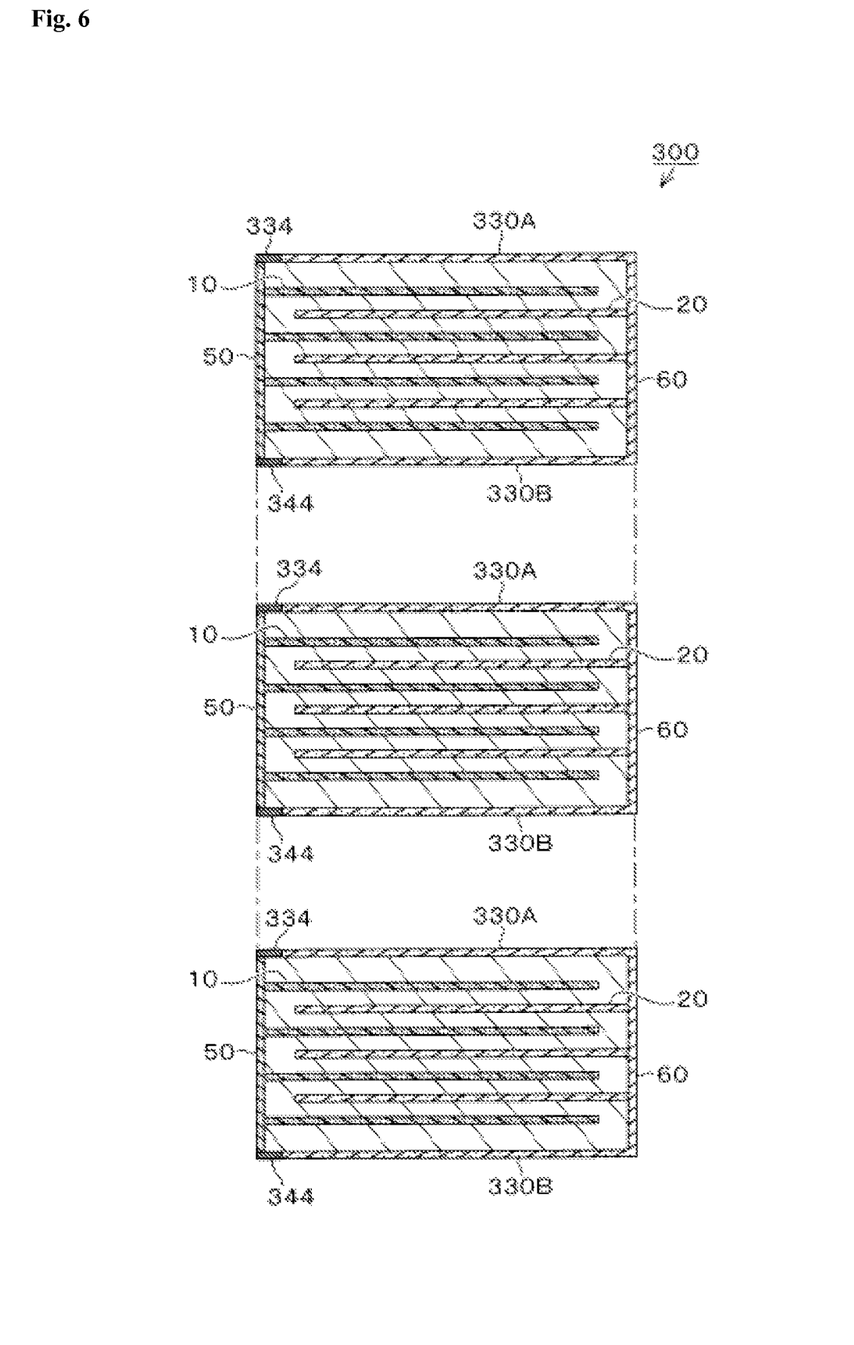
FIG. 6 is a drawing showing a piezoelectric element pertaining to another embodiment of the present invention.

Example 3 of the present invention is explained by referring to FIG. 6. The number of laminated layers of a piezoelectric layer (total sum of the number of laminated layers of piezoelectric layer 12 and the number of laminated layers of piezoelectric layer 22, which is the same as the number of laminated layers of an internal electrode) is an odd number. FIG. 6 shows the piezoelectric element 300 pertaining to Example 3 of the present invention. Each unit piezoelectric element constituting this piezoelectric element 300 is comprised of a total of seven piezoelectric layers including four piezoelectric layers 12 (four layers of internal electrodes 10) and three piezoelectric layers 22 (three layers of internal electrodes 20). As illustrated, the external electrode 60 is connected to the cover electrode 330A on the top side and cover electrode 330B on the bottom side, respectively. The external electrode 50 is not connected to the cover electrodes, but insulation layers 334, 344 are formed between the external electrode 50 and cover electrodes 330A, 330B to insulate the two electrodes and align their thicknesses.

In this example, a stacked actuator can be obtained by overlaying the piezoelectric elements 300 in the same orientation, as shown in FIG. 6. Connection of the cover electrode 330A and cover electrode 330B, and interconnection of the external electrodes 50, can be implemented by the same methods shown in FIG. 3.

Example 4

Figure 7:
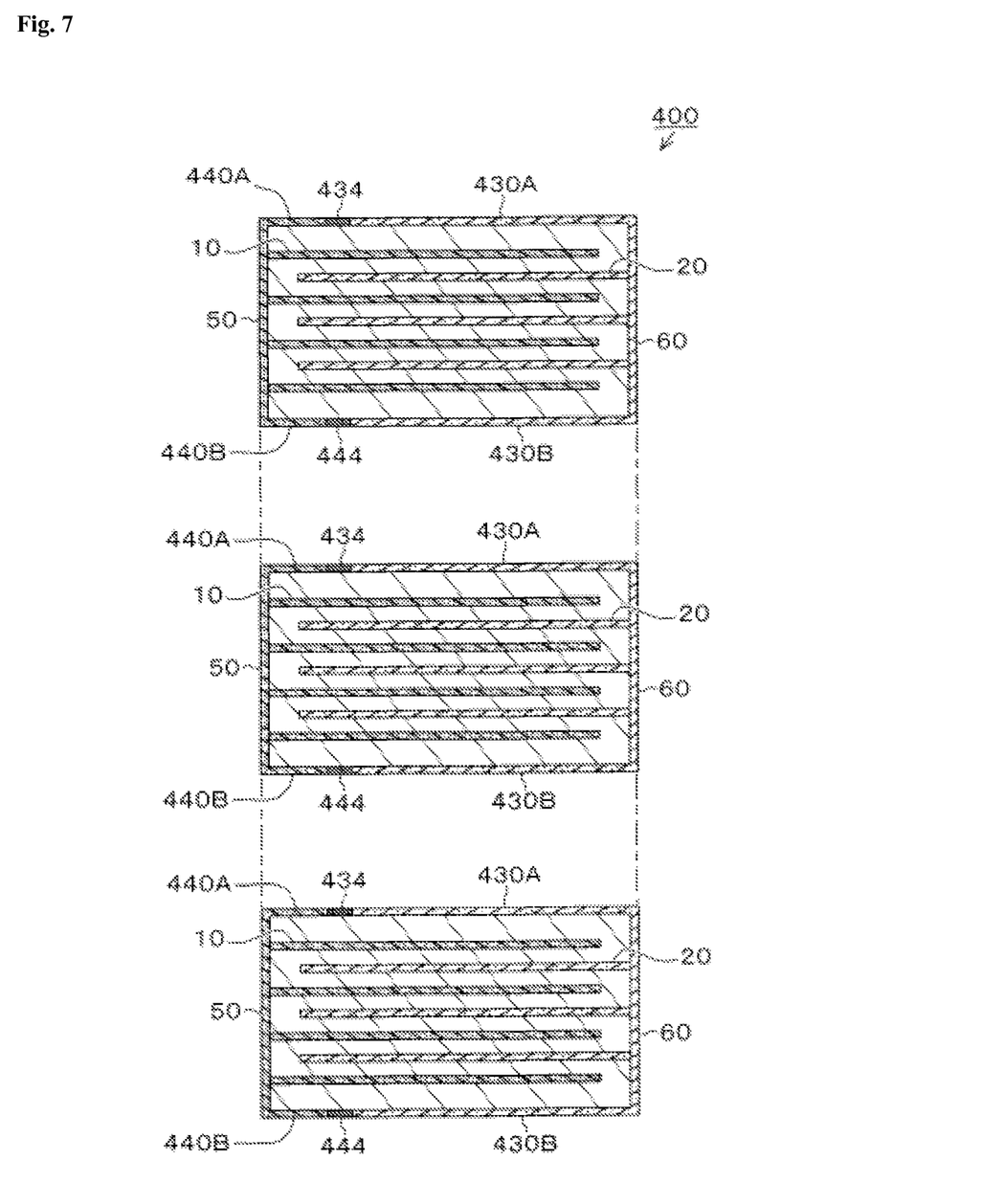
FIG. 7 is a drawing showing a piezoelectric element pertaining to another embodiment of the present invention.

Example 4 of the present invention is explained by referring to FIG. 7. In this example, the number of laminated layers of a piezoelectric layer is also an odd number. As illustrated, the external electrode 60 of the piezoelectric element 400 is connected to the cover electrode 430A on the top side and cover electrode 430B on the bottom side, respectively. On the other hand, the external electrode 50 is connected to the cover electrode 440A on the top side and cover electrode 440B on the bottom side, respectively.

In this example, on both the top side and bottom side of the piezoelectric element 400, the cover electrodes 430A, 430B connected to the external electrode 60 are set larger in area than the cover electrodes 440A, 440B connected to the external electrode 50, and insulation layers 434, 444 are formed around them to insulate the two electrodes and align their thicknesses.

In this example, too, a stacked actuator can be obtained by overlaying the piezoelectric elements 400 in the same orientation. In this example, cover electrodes of different polarities are exposed to both the top side and bottom side of the piezoelectric element 400. When these piezoelectric elements 400 are stacked, therefore, their external electrodes can be inter-connected without providing a bridge between the external electrodes. Additionally, leader lines can be provided on the same end face for application of drive voltage.

The present invention is not limited in any way to the examples mentioned above, and various changes can be added to the extent not deviating from the key points of the present invention. For example, the following changes can be added:

(1) The shape/dimensions and material of each part, the number of laminated layers of a piezoelectric layer, the number of laminated layers of a piezoelectric element and the like, as shown in the examples above, are only examples and can be changed as necessary and deemed appropriate.
(2) The examples above can be combined as desired. When multiple piezoelectric elements are stacked, for example, a cover electrode structure having the shape shown in FIG. 5 (A) can be provided at the top end and bottom end, or on the surface of either the top or bottom piezoelectric element, to provide leader lines on the same end face for application of drive voltage.
(3) Protective layers for protection of cover electrodes can be formed additionally. Protective layers can use flexible materials.
(4) Stacked piezoelectric structures conforming to the present invention can be applied to stacked piezoelectric actuators, and this does not prevent the application to other components.
(5) In the examples above, only piezoelectric elements having an even number of laminated layers of a piezoelectric layer, or only piezoelectric elements having an odd number of laminated layers of a piezoelectric layer, were stacked, but piezoelectric elements having an even number of laminated layers of a piezoelectric layer can be stacked with piezoelectric elements having an odd number of laminated layers of a piezoelectric layer. For example, the piezoelectric elements 300 in FIG. 6 can be stacked instead of the piezoelectric elements 100C in FIG. 3.

INDUSTRIAL APPLICABILITY

Each embodiment of the present invention is suitable for stacked piezoelectric actuators, etc., because at least an area near the center of the cover is polarized and activated, and therefore displacement transmission losses can be reduced and crack generation prevented when the elements are connected.

DESCRIPTION OF THE SYMBOLS 10, 10A, 10B, 20: Internal electrode
12, 22: Piezoelectric layer
30, 30A, 30B, 40: Cover electrode
32, 42: Cover
34, 44: Insulation layer
50, 60: Outer electrode
70: Adhesive layer
72: Insulation layer
74: Bridge
100, 100A to 100C: Piezoelectric element
110: Stacked piezoelectric actuator
120, 122: Piezoelectric element
200: Piezoelectric element
200A, 200B, 200C: Piezoelectric element
230A, 230B: Cover electrode
234: Insulation layer
240A, 240B: Cover electrode
244: Insulation layer
250: Spring means
252: Spacer
300: Piezoelectric element
330A, 330B: Cover electrode
334, 344: Insulation layer
340A, 340B: Cover electrode
400: Piezoelectric element
430A, 430B: Cover electrode
434, 444: Insulation layer
440A, 440B: Cover electrode

What is claimed is:

1. A stacked piezoelectric structure made by stacking multiple piezoelectric elements, where each of the multiple piezoelectric elements comprises:
   a laminated structure made by alternately laminating multiple first piezoelectric layers having first internal electrodes led out to a first area and multiple second piezoelectric layers having second internal electrodes led out to a second area different from the first area;
   a pair of covers constituted by piezoelectric bodies that are provided at both ends of the laminated structure in the laminating direction;
   a pair of cover electrodes provided on the respective exposed sides of the pair of covers, in a manner covering an area at least near the center of the corresponding cover, wherein an insulation layer is formed around each cover electrode which has an area smaller than that of the first or second internal electrode;
   a first external electrode that applies drive voltage of first polarity to each of the first internal electrodes; and
   a second external electrode that applies drive voltage of second polarity to each of the second internal electrodes;
   wherein said piezoelectric element is such that:
   when each of the pair of cover electrodes is adjoining the first internal electrode, the cover electrode adjoining the first internal electrode is connected to the second external electrode; and
   when each of the pair of cover electrodes is adjoining the second internal electrode, the cover electrode adjoining the second internal electrode is connected to the first external electrode,
   wherein the cover electrodes of adjacent piezoelectric elements, which cover electrodes face toward and are connected to each other, are connected to the external electrodes that apply drive voltage of a same polarity which is one of the first or second polarity, and the other external electrodes of the adjacent piezoelectric elements that apply drive voltage of the other polarity are connected to each other by a bridge formed using a conductive paste; and
   the first external electrodes of the adjacent piezoelectric elements become flush with each other, and the second external electrodes of the adjacent piezoelectric elements become flush with each other.

2. A stacked piezoelectric structure according to claim 1, wherein the first and second external electrodes of each piezoelectric element are provided on the side faces of the laminated structure in a manner extending in the laminating direction thereof.

* * * * *